United States Patent [19]

Solin

[11] Patent Number: 5,646,051
[45] Date of Patent: Jul. 8, 1997

[54] PROCESS FOR FORMING A MAGNETORESISTIVE SENSOR FOR A READING HEAD

[75] Inventor: Stuart A. Solin, Princeton Junction, N.J.

[73] Assignee: NEC Research Institute, Inc., Princeton, N.J.

[21] Appl. No.: 435,254

[22] Filed: May 5, 1995

[51] Int. Cl.$^6$ ............................................. H01L 21/00
[52] U.S. Cl. .................. 437/7; 437/918; 148/DIG. 136; 360/113
[58] Field of Search ............. 437/7, 918; 148/DIG. 136; 360/113

[56] References Cited

U.S. PATENT DOCUMENTS

| | | | |
|---|---|---|---|
| 3,617,975 | 11/1971 | Wieder | 338/32 |
| 5,065,130 | 11/1991 | Eck et al. | 338/32 R |
| 5,438,470 | 8/1995 | Ravipati et al. | 360/113 |
| 5,491,600 | 2/1996 | Chen et al. | 360/113 |
| 5,496,759 | 3/1996 | Yue et al. | 437/52 |

*Primary Examiner*—Tuan H. Nguyen
*Attorney, Agent, or Firm*—Arthur J. Torsiglieri; Jeffery J. Brosemer

[57] ABSTRACT

A magnetic sensor for use in a reading head for a magnetic disk is formed by depositing a plurality of planar superimposed layers of metals and semiconductors and using for the active element a planar structure formed orthogonal to the superimposed layers by their edges. Specifically, the edges of the superimposed layer form on the orthogonal planar surface a Corbino-disk structure in which conductive regions form inner and outer electrodes about an annular semiconductive region with high magnetoresistance, such as is provided by cadmium mercury telluride or indium antimonide.

2 Claims, 2 Drawing Sheets

PROCESS FOR FORMING A MAGNETORESISTIVE SENSOR FOR A READING HEAD

FIELD OF THE INVENTION

This relates to a new process for fabricating semiconductive devices that have small dimensions.

The invention is of particular interest to the fabrication of a sensor that uses a Corbino disk-like structure for use as the active element in reading a magnetic pattern stored on a magnetic disk, as is described in copending application Ser. 08/396,819 filed Mar. 2, 1995, assigned to the same assignee as the instant application.

BACKGROUND OF THE INVENTION

As is known, a Corbino disk comprises a magnetoresistive element, an inner electrode surrounded by the magnetoresistive element and an outer electrode surrounding the magnetoresistive element. When a voltage is applied across the inner and outer electrodes to establish a radial electric field in the magnetoresistive element and the element is used to read a pattern stored on a magnetic disk, the current flowing between the electrodes will be modulated by magnetic passing perpendicularly through the radial electric field and such modulation can be detected and amplified to provide a replica of the signal information stored on the magnetic disk. Because of the small dimensions involved in such a sensor, it is difficult to make it reliably and simply.

The main object of the present invention is a process for making such a device reliably and simply, but it will be appreciated that the principles involved in the processing should have wider application to the processing of other semiconductive devices.

SUMMARY OF THE INVENTION

A feature of the invention is that it is formed by various layers of different characteristics superimposed on one another to form a stack and edges of various layers of the stack are made to form a planar surface that includes a structure of the kind desired, specifically, a Corbino disk-like structure in the preferred embodiment. A feature of the invention is that most dimensions of the device are determined by the thickness and width of deposited layers which make control of the dimensions relatively easy. Moreover, by appropriate choice of the geometry of the layers, particularly the width, layers of the same material that were not deposited in succession may be made to link with one another in a fashion to enclose layers of a different material that were deposited between the layers of the same material.

Accordingly, the process of the invention, as applied to the manufacture of a Corbino disk-like structure, involves depositing a layer of a suitable magnetoresistive material over an active edge portion of a conductive substrate, which may be a metal layer previously deposited on a suitable support to serve as part of the outer electrode. The thickness of the magnetoresistive layer is chosen to be equal to the separation desired between the inner and outer electrodes, one parameter of the magnetoresistive layer in the final device.

Then a layer of insulator is deposited over part of the substrate, leaving uncovered an edge portion that had been covered by the magnetoresistive layer. This insulator layer will serve to isolate a conductive second layer, to be deposited next for serving as the inner electrode, from the conductive substrate where not separated by the first magnetoresistive layer.

Next, a second layer of magnetoresistive material, generally the same material as that for the first magnetoresistive layer, is deposited along the active edge overlying a portion of the conductive layer. This layer will form another portion of the magnetoresistive material between the inner electrode and a portion of the outer electrode, and its thickness should be essentially the same as that of the first magnetoresistive layer.

Finally, a third layer of conductive material, advantageously the same as was used for the first and second conductive layers, is deposited along the active edge to overlie only a portion of the second semiconductive layer to Form the remainder of the outer electrode.

The invention will be understood better from the following more detailed description taken in conjunction with the accompanying drawing:

DETAILED DESCRIPTION OF THE INVENTION

Figure 1:
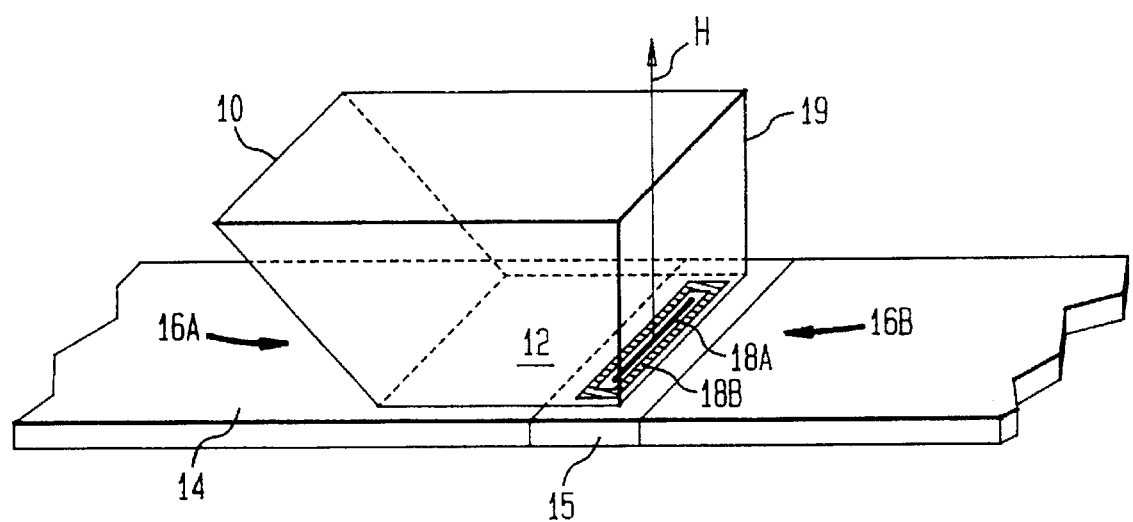
FIG. 1 shows a reading head including a magnetoresistive sensor of the kind that is described in the aforementioned earlier filed application and that the preferred embodiment of the present invention is designed to provide.

With reference now to FIG. 1, the reading head 10, including the active element 12 that serves as the magnetic sensor, is shown positioned over a portion of the magnetic medium 14 of a disk in whose tracks is stored the information to be read. The information is read by sensing the external vertical magnetic field H created above the transition regions 15 between directional changes of the aligned magnetic moments 16A, 16B that extend along the track of the magnetic medium 14.

The active element 12 is formed by a Corbino disk-like structure that includes a layer of semiconductive material that exhibits a strong magnetoresistive effect. The active element further includes a first inner electrode 18A that is surrounded by the semiconductive material and a second outer electrode 18B that surrounds the inner electrode, in the manner characteristic of a Corbino disk. Typically, the outer electrode 18B, which is shown rectangular in shape, has a long dimension of about 5 microns to match approximately the width of a track of the magnetic medium and a narrow dimension of about 500 to 1,000 Angstroms. Typical dimensions of the inner electrode 18A are a length of about 1 micron and a width of about 200–400 Angstroms.

Figure 2A:
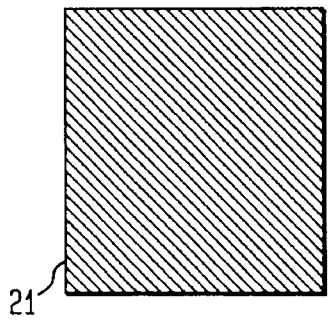
FIGS. 2A through 2F illustrate the significant deposition steps in the process of the invention as applied to the preparation of a magnetoresistive sensor of the kind to be included in the reading head of FIG. 1.
Figure 2B:
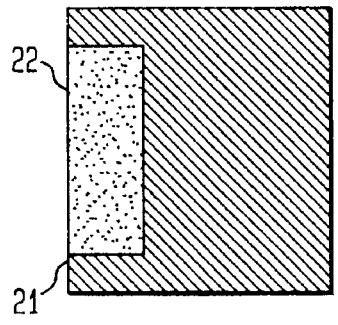
Figure 2C:
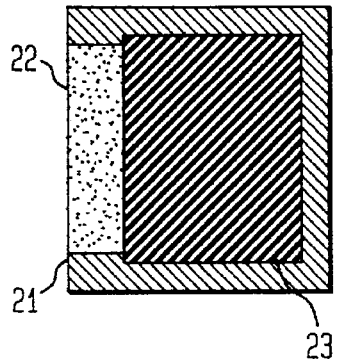
Figure 2D:
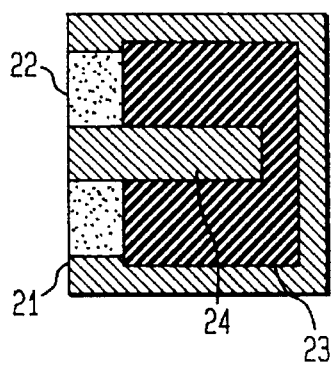
Figure 2E:
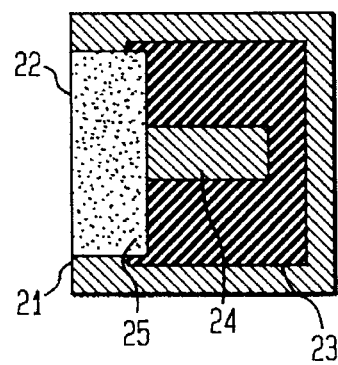

In accordance with the present invention, the active element positioned on the reading head is prepared as follows. On the surface corresponding to the vertical edge of a reading head, such as surface 19 shown in FIG. 1, there is deposited a first conductive layer, typically of a metal, to a thickness sufficient to ensure high conductivity, and typically at least several hundred Angstroms thick, as depicted by layer 21 in FIG. 2A. Next, a second layer of a semiconductor with a strong magnetoresistive effect is deposited, advantageously, to a thickness of at least 100 Angstroms, over the left edge portion of the layer 21 to form layer 22, as depicted in FIG. 2B. Next, an insulating third layer, advantageously at least several hundred Angstroms thick to function well as a high resistance barrier, is deposited, as depicted by layer 23 in FIG. 2C. The third layer overlaps the inner right edge of the semiconductive layer 22. Next, a conductive fourth layer 24 in strip form, is deposited, extending from the left edge over much of the width of the layer 23, as shown in FIG. 2D. Next, a semiconductive fifth layer 25 of the same material as layer 22 is deposited along the left edge to overlie completely the semiconductive second layer 22 and to extend therepast to overlie the left edge of the insulator layer 23 as shown in FIG. 2E. Finally, a conductive sixth layer 26 is deposited as shown in FIG. 2F, extending along the left edge essentially the full height of conductive first layer 21 and extending over the left edge portion of semiconductive layer 25.

Figure 3:
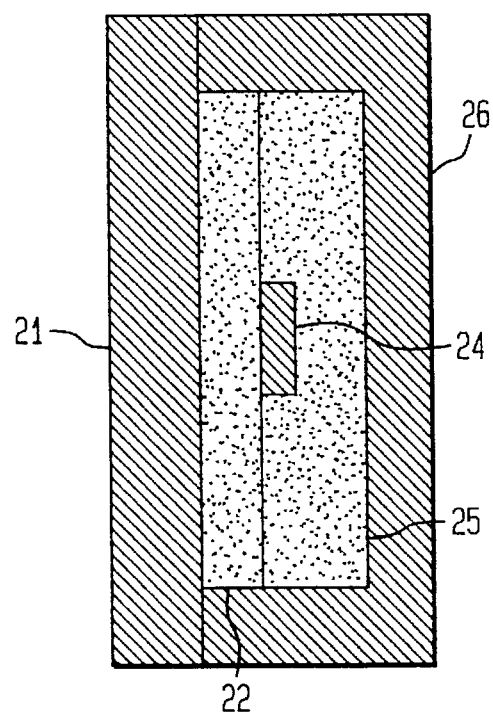
FIG. 3 shows the magnetoresistive sensor made by the process illustrated by FIG. 2, as viewed looking at the plane that is to be proximate to the magnetic disk when the sensor is positioned for use on the reading head.
Figure 2F:
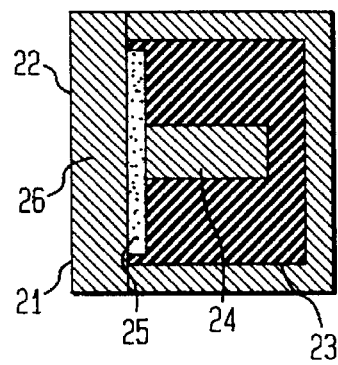

FIG. 3 shows a magnetoresistive sensor formed in the plane along the left edge of the structure of FIG. 2F, by the stack of the six deposited layers as viewed straight on. The plane includes the left edge of the conductive layer first 21, then the left edge of the semiconductive second layer 22, the left edge of the conductive fourth layer 24, then the left edge of the semiconductive fifth layer 25, and finally, the left edge of the conductive sixth layer 26. The insulating third layer is not seen since it is buried in the interior. Separate terminal connections (not shown) would be provided to the inner and outer electrodes corresponding to layer 24 and layer 26.

Any of the techniques known to workers in the art can be used to deposit and shape the desired layers. These include the photolithographic, etching and deposition techniques common in semiconductive device processing. It is important that the surface of the sensor that will be proximate to the magnetic disk be essentially smooth to permit the surface to be maintained close to the disk as the disk rotates, with little danger of contact that might erode the surface of the disk undesirably. It is not especially important that the other surfaces of the magnetic sensor be smooth.

It is also important that the method used to form the magnetoresistive semiconductive layers be one that allows the deposited semiconductive material to exhibit high magnetoresistance, even in polycrystalline form. Cadmium mercury tellurium (CD0.9Hg0.1Te) is a compound semiconductor that has a high magnetoresistance even in polycrystalline form, particularly if comprised of relatively large crystallites. Various other compound semiconductors that have high electron mobility and so high magnetoresistance should also be useful, such as indium antimonide.

The material used for the conductive layers advantageously may be of a metal. Preferably the metal should be one that makes possible layers of low resistance contact to the material chosen for the semiconductive layer. Tin, indium and gold are expected to be particularly favorable choices with the mentioned semiconductive materials.

The choice of the material for the insulating layer will be influenced by the need for compatibility with the other layers. Various forms of silicon oxides should be particularly favorable choices.

The dimensions of the various layers will usually be dictated by the characteristics of the magnetic disk being read. The long dimension of the sensor as seen in FIG. 3 should essentially match the width of the track being read since wider widths would increase crosstalk and narrower widths would reduce sensitivity. Similarly, for high sensitivity the narrow dimension of the sensor, as viewed in FIG. 3, advantageously should match the width of the regions of high magnetic signal strength where occur the reversals of polarities of the magnetic domains that give rise to the external magnetic fields that form the signals to be read.

It is apparent that the technique of stacking layers in the manner described to form at an edge surface of the stack a desired pattern of insulative, conductive and semiconductive regions is capable of a wide range of applications so that the specific application described is to be understood as merely illustrative of the general principles of the invention. Various other modifications may be devised without departing from the spirit and scope of the invention.

What is claimed is:

1. A process of forming a semiconductive device comprising the steps of:

forming a conductive first layer on a support member, the layer having an active edge and a non-active oppositely positioned non-active edge;

depositing a semiconductive second layer over a portion of the first layer, the second layer having an active edge coplanar with the active edge of the first layer, leaving a portion of the first layer exposed;

depositing an insulative third layer over part of the exposed portion of the first layer and overlapping a portion of the semiconductive second layer along the edge opposite its active edge;

depositing a conductive fourth layer that has an active edge coplanar with the active edges of the first and second layers and extends across the width of the entire second layer and a portion of the third layer;

depositing a semiconductive fifth layer that has an active edge coplanar with the active edges of the first, second, and fourth layers and that extends completely across the semiconductive second layer, to contact the third layer; and depositing a conductive sixth layer that has an active edge that is coplanar with the active edges of the first, second, fourth and fifth layers and extends completely across the fourth layer and contacts the first layer whereby the active edge portions of the first, third, fourth, and sixth layers form an inner planar surface that includes a conductive region made up of part of the fourth layer that is surrounded by a semiconductive region made up of parts of the second and fifth layers that is surrounded by an outer conductive region made up of parts of the first and sixth layers.

2. The process of claim 1 in which the first, fourth and sixth layers are metallic and the second and fifth layers are of a magnetoresistive compound semi-conductor material.

* * * * *